United States Patent
Bower et al.

(10) Patent No.: US 7,366,623 B2
(45) Date of Patent: Apr. 29, 2008

(54) METHOD AND APPARATUS FOR CHARACTERIZING A LOAD ON A DATA LINE

(75) Inventors: Ian Llyod Bower, Bedford, TX (US); Dale Dietrick Wellborn, Summerland (CA); Barry Jon Male, West Granby, CT (US)

(73) Assignee: Texas Instruments Incorporated, Dallas, TX (US)

( * ) Notice: Subject to any disclaimer, the term of this patent is extended or adjusted under 35 U.S.C. 154(b) by 334 days.

(21) Appl. No.: 11/138,121

(22) Filed: May 26, 2005

(65) Prior Publication Data

US 2006/0271992 A1 Nov. 30, 2006

(51) Int. Cl.
*G01R 19/00* (2006.01)
(52) U.S. Cl. ...................................................... 702/64
(58) Field of Classification Search ................. 702/57, 702/60, 64, 65, 183, 188, 193; 379/30, 32.01; 327/53, 54, 57; 324/533, 713; 361/79
See application file for complete search history.

(56) References Cited

U.S. PATENT DOCUMENTS

| | | | | |
|---|---|---|---|---|
| 5,631,569 A | * | 5/1997 | Moore et al. ................ | 324/713 |
| 5,808,496 A | * | 9/1998 | Thiel ........................... | 327/210 |
| 6,307,405 B2 | * | 10/2001 | Forbes et al. ................. | 327/54 |
| 6,397,156 B1 | * | 5/2002 | Bachmann et al. ........... | 702/65 |
| 6,654,220 B2 | * | 11/2003 | Stanimirov et al. ........... | 361/79 |
| 2002/0097055 A1 | * | 7/2002 | Pinzon et al. ................ | 324/525 |
| 2004/0232919 A1 | * | 11/2004 | Lacey ......................... | 324/533 |
| 2005/0192765 A1 | * | 9/2005 | Slothers et al. ............... | 702/57 |
| 2006/0091892 A1 | * | 5/2006 | Petrescu et al. ............. | 324/433 |

* cited by examiner

*Primary Examiner*—Edward Raymond
*Assistant Examiner*—Mohamed Charioui
(74) *Attorney, Agent, or Firm*—Wade J. Brady, III; Frederick J. Telecky, Jr.

(57) ABSTRACT

A method for characterizing a load on a data line includes the steps of: (A) Applying at least three successive voltages to the data line. Each respective odd-numbered successive voltage of the at least three successive voltages has substantially a first voltage value displaced a first voltage interval from a reference voltage value. Each respective even-numbered successive voltage of the at least three successive voltages has substantially a second voltage value displaced a second voltage interval from the reference voltage value. (B) Measuring a respective current value on the data line while each of the at least three successive voltages is applied to the data line. (C) Comparing the respective current values for selected successive voltages of the at least three successive voltages to determine whether a hysteric impedance change occurs when voltage on the data line is varied.

15 Claims, 2 Drawing Sheets

__US 7,366,623 B2__

METHOD AND APPARATUS FOR CHARACTERIZING A LOAD ON A DATA LINE

BACKGROUND OF THE INVENTION

The present invention is directed to evaluation of a data line to determine whether a load on the data line is appropriate for powering using the data line. Some equipment is configured to accept operating power from an attached data line over which data is received. Such data line-provided power is appropriate for certain loads, such as resistive loads, but is not appropriate for other loads, such as capacitive loads. Certain industry standards set forth criteria by which it may be determined whether a device attached to a data line is an appropriate device for powering using the data line. By way of example and not by way of limitation, an exemplary industry standard allows powering a load (i.e., a device) in an Ethernet system when the load is measured within tolerances of 25 K$\Omega$.

A problem exists, however, when the load is in the nature of a capacitive load. Multiple attempts to power a capacitive load may cause the load to charge and eventually reach a charge level where the load appears to be a 25 K$\Omega$ load. A system looking for a qualifying impedance level (e.g., 25 K$\Omega$) may erroneously power such a charged capacitive load and may damage the powered device. When power-level signals are provided to logic-level circuitry, the logic-level circuitry may be damaged or destroyed.

There is a need for a method and apparatus for characterizing a load on a data line that can distinguish among load-types.

In particular, there is a need for a method and apparatus for characterizing a load on a data line that can distinguish between resistive loads and non-resistive loads.

SUMMARY OF THE INVENTION

A method for characterizing a load on a data line includes the steps of: (A) Applying at least three successive voltages to the data line. Each respective odd-numbered successive voltage of the at least three successive voltages has substantially a first voltage value displaced a first voltage interval from a reference voltage value. Each respective even-numbered successive voltage of the at least three successive voltages has substantially a second voltage value displaced a second voltage interval from the reference voltage value. (B) Measuring a respective current value on the data line while each of the at least three successive voltages is applied to the data line. (C) Comparing the respective current values for selected successive voltages of the at least three successive voltages to determine whether a hysteric impedance change occurs when voltage on the data line is varied.

An apparatus for characterizing a load on a data line includes: (A) A voltage generating device coupled with the data line for applying a plurality of successive voltages to the data line. (B) A current measuring device coupled with the data line for measuring current on the data line while a selected successive voltage of the plurality of successive voltages is applied to the data line. (C) A current comparing device coupled with the current measuring device for comparing various currents measured on the data line. The current comparing device evaluates the comparing to determine whether a hysteric impedance change occurs on the data line when voltage on the data line is varied.

It is, therefore, a feature of the present invention to provide a method and apparatus for characterizing a load on a data line that can distinguish among load-types.

It is a further feature of the present invention to provide a method and apparatus for characterizing a load on a data line that can distinguish between resistive loads and non-resistive loads.

Further features of the present invention will be apparent from the following specification and claims when considered in connection with the accompanying drawings, in which like elements are labeled using like reference numerals in the various figures, illustrating the preferred embodiments of the invention.

DETAILED DESCRIPTION OF THE PREFERRED EMBODIMENT

Some industry standards provide, by way of example and not by way of limitation, that a load on a data line must be within predetermined tolerances of a particular impedance to permit providing power to a device via the data line. Powering devices using an attached data line is convenient in certain configurations, such as wireless access modems and Internet protocol (IP) phones. Powering a device using a data line avoids the inconvenience and expense of having to install conduit containing power lines (e.g., 120 volt lines) to a receptacle into which the device may be plugged or otherwise connected to access operating power.

Typically, devices appropriate for powering using a data line present a substantially resistive impedance to the data line. If a device presents a non-resistive impedance to an attached data line, such as a capacitive impedance, there is a risk that the device is not configured for powering via the data line. The device may be damaged if it is powered up using the data line.

Such a situation is potentially present when seeking to characterize a load coupled with a data line. If a load is a capacitive load, by way of example and not by way of limitation, a voltage provided on the data line may charge the capacitor and make the load appear to be substantially resistive. If the device is then powered using the data line, power may be actually provided to circuitry in the device that is intended to handle data-level signals and is not intended to withstand power-level signals. A result may be damage to or destruction of the attached device.

The present invention permits assurance that a load coupled with a data line is substantially resistive so that powering a non-resistive load may more assuredly be avoided than is likely using prior art methods and apparatuses.

Figure 1:
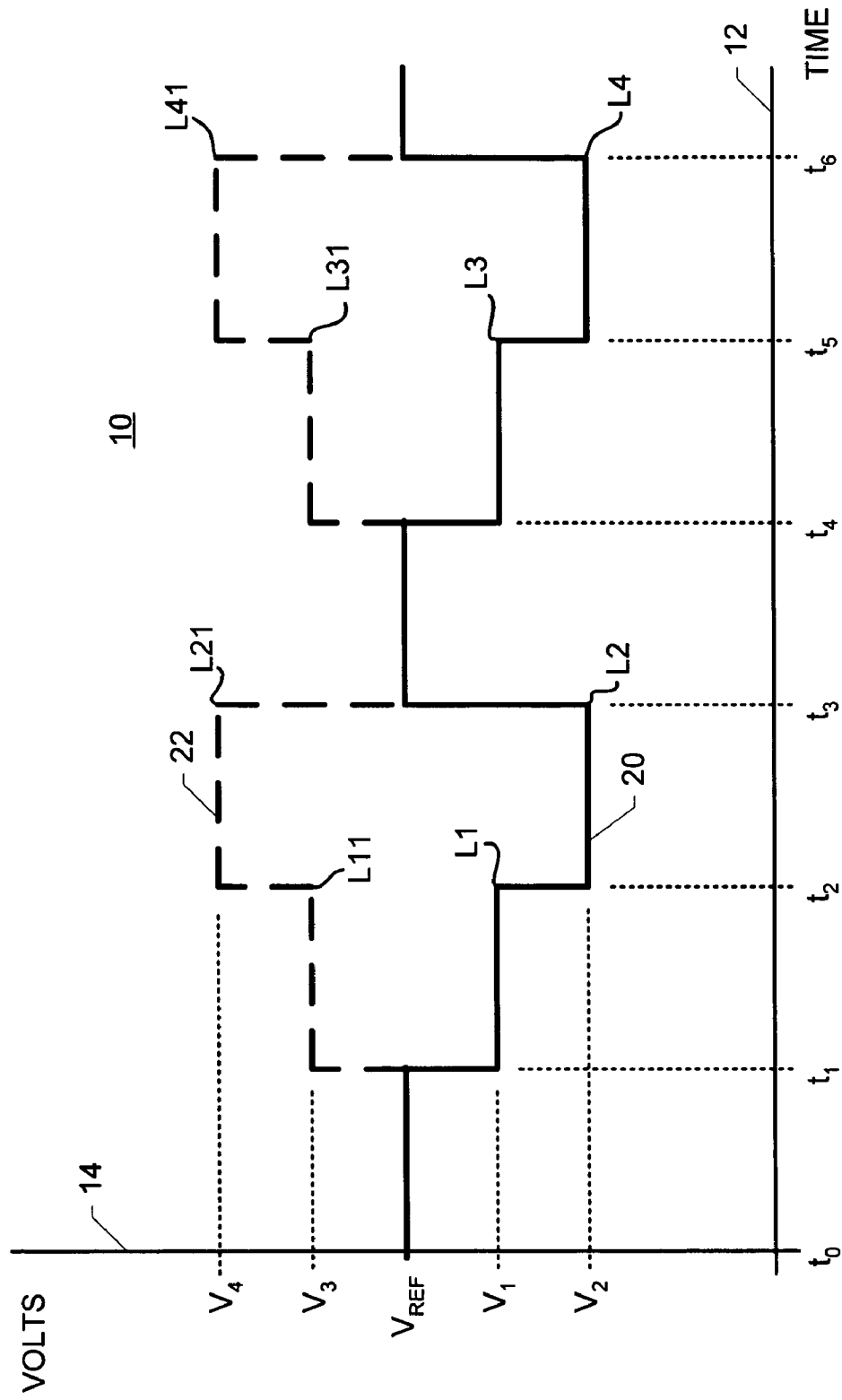
FIG. 1 is a schematic diagram illustrating the method of the present invention.

FIG. 1 is a timing diagram illustrating the method of the present invention. In FIG. 1, a graphic representation 10 of voltages on a data line is presented with respect to time indicated on a horizontal axis 12 and with respect to volts indicated on a vertical axis 14. A solid-line response curve 20 represents a first signaling scheme for carrying out a first embodiment of the method of the present invention. A dotted-line response curve 22 represents a second signaling scheme for carrying out an alternate embodiment of the method of the present invention. By way of example and not by way of limitation, response curves 20, 22 are substantially symmetrically oriented about a reference voltage $V_{REF}$.

Regarding first response curve 20, a test data line (not shown in FIG. 1) being evaluated for load-type is maintained at a voltage level $V_{REF}$ during time interval $t_0$-$t_1$. At time $t_1$, a first voltage $V_1$ is applied to the test data line. First voltage $V_1$ is established at a voltage interval ($V_{REF}$–$V_1$) displaced from reference voltage $V_{REF}$. During the time interval $t_1$-$t_2$, a first current $I_1$ through the test data line may be measured, as at locus L1 [located in FIG. 1 at ($t_2$, $V_1$)].

At a time $t_2$, a second voltage $V_2$ is applied to the test data line. Second voltage $V_2$ is established at a voltage interval ($V_1$–$V_2$) displaced from first voltage $V_1$. During the time interval $t_2$-$t_3$, a second current $I_2$ through the test data line may be measured, as at locus L2 [located in FIG. 1 at ($t_3$, $V_2$)].

At time $t_3$, voltage applied to the test data line is changed again to a new interim voltage level nearer to reference voltage $V_{REF}$. By way of example and not by way of limitation the interim voltage level may be substantially equal with reference voltage $V_{REF}$ (as shown in FIG. 1), may be another voltage level between voltage $V_2$ and reference voltage level $V_{REF}$ or may be another voltage level above reference voltage $V_{REF}$. In the exemplary embodiment illustrated in FIG. 1, the voltage level during the time interval $t_4$-$t_5$ is substantially equal with first voltage level $V_1$. During the time interval $t_4$-$t_5$, a third current $I_3$ through the test data line may be measured, as at locus L3 [located in FIG. 1 at ($t_5$, $V_1$)].

Prior art methods for evaluating load on the test data line calculated an impedance change value $\Delta Z_1$:

$$\Delta Z_1 = \frac{V_{L2} - V_{L1}}{I_{L2} - I_{L1}} \quad [1]$$

Where, $V_{Ln}$ indicated voltage at locus Ln; and
$I_{Ln}$ indicated current at locus Ln.

Value for $\Delta Z_1$ was tested in prior art methods vis-à-vis a standards-set impedance level to decide whether power should be provided to the device then-attached with the data line that was being tested. Such computations to determine impedance on a data line may liable to be "fooled" if certain types of loads are attached to the tested data line. By way of example and not by way of limitation, if the load attached to the tested data line has a capacitive component one could be charging the capacitive component of the load while applying various test voltages to the data line, as described above. It is possible that the capacitive load component may be charged to a level to erroneously indicate the appropriate resistive load (e.g., 25 KΩ) is attached to the test data line. That is, there could be a false indication of presence of a correct resistive load for accepting power over the data line. If one then provided power over the tested data line, one may be providing power to circuitry designed to accept data-level signals that are significantly lower levels than power-level signals. The result could be a seriously damaged component attached to the tested data line.

The present invention provides for at least three test measurements to ascertain the nature of the load attached to the tested data line. Voltage readings are conducted during time interval $t_1$-$t_2$, during time interval $t_2$-$t_3$ and during time interval $t_4$-$t_5$ as described above in connection with the prior art testing approach. An alternate embodiment of the present invention also includes conducting a voltage reading during time interval $t_5$-$t_6$. According to the method of the present invention, one would evaluate load on the test data line by calculating the impedance change value $\Delta Z_1$ (as described in expression [1] above) and impedance change value $\Delta Z_2$:

$$\Delta Z_2 = \frac{V_{L3} - V_{L1}}{I_{L3} - I_{L1}} \quad [2]$$

The method of the present invention compares $\Delta Z_1$ with $\Delta Z_2$. When voltage during time interval $t_1$-$t_2$ is substantially equal with voltage during time interval $t_3$-$t_4$ and the load on the tested data line is substantially resistive then $\Delta Z_1$ should substantially equal $\Delta Z_2$. If voltages during time intervals $t_1$-$t_2$ and $t_1$-$t_2$ are not substantially equal one may provide prepared reference values for $\Delta Z_1$, $\Delta Z_2$ to indicate whether a hysteric impedance change occurred in time interval $t_3$-$t_3$ as compared with time interval $t_1$-$t_2$. A hysteric impedance change (i.e., a non-linear impedance change) indicates presence of a load component other than a resistive component, such as a capacitive load component. Such a hysteric impedance change may alert a system or operator to avoid providing power via the data line to the device coupled with the tested data line.

Further assurance of the accuracy of one's conclusion regarding the load coupled with the tested data line may be provided by another test voltage and test current. At a time $t_5$, another voltage level further displaced from reference voltage $V_{REF}$ than voltage level $V_1$ may be applied to the test data line. In the exemplary embodiment illustrated in FIG. 1, the voltage level established at time $t_5$ is substantially equal with second voltage level $V_2$. During the time interval $t_5$-$t_6$, a fourth current $I_4$ through the test data line may be measured, as at locus L4 [located in FIG. 1 at ($t_6$, $V_2$)]. An impedance change $\Delta Z_3$ may be calculated:

$$\Delta Z_3 = \frac{V_{L4} - V_{L3}}{I_{L4} - I_{L3}} \quad [3]$$

Comparing impedance change $\Delta Z_3$ vis-à-vis impedance change $\Delta Z_2$ to observe whether a hysteric impedance change occurs as voltage on the test data line is changed to a value relatively further displaced from reference voltage $V_{REF}$ may provide confirmation of observations made while comparing impedance changes $\Delta Z_1$, $\Delta Z_2$.

In the preferred embodiment of the method of the present invention, voltages applied to a test data line are substantially equal during time intervals $t_1$-$t_2$, $t_3$-$t_4$ and are substantially equal during time intervals $t_2$-$t_3$, $t_5$-$t_6$. By way of example and not by way of limitation, observing test information to detect hysteric impedance change may be carried out with a significant level of confidence by comparing two or more of:

$$\Delta Z_1 = \frac{V_{L2} - V_{L1}}{I_{L2} - I_{L1}} \quad [1]$$

$$\Delta Z_2 = \frac{V_{L3} - V_{L1}}{I_{L3} - I_{L1}} \quad [2]$$

$$\Delta Z_3 = \frac{V_{L4} - V_{L3}}{I_{L4} - I_{L3}} \quad [3]$$

-continued $$\Delta Z_4 = \frac{V_{L3} - V_{L2}}{I_{L3} - I_{L2}} \quad [4]$$

$$\Delta Z_5 = \frac{V_{L4} - V_{L1}}{I_{L4} - I_{L1}} \quad [5]$$

Other comparisons may also be useful in evaluation a load coupled with a data line.

The signaling scheme described above is representative only and may be effected using other relative levels of test voltages, so long as impedance differences are of sufficient magnitudes and relative levels to present comparisons appropriate for detecting hysteric impedance changes in a load coupled with a data line.

By way of example and not by way of limitation, dotted-line response curve 22 represents a second signaling scheme for carrying out an alternate embodiment of the method of the present invention. Regarding second response curve 22, a test data line (not shown in FIG. 1) being evaluated for load-type is maintained at a voltage level $V_{REF}$ during time interval $t_0$-$t_1$. At time $t_1$, a third voltage $V_3$ is applied to the test data line. Third voltage $V_3$ is established at a voltage interval ($V_3$-$V_{REF}$) displaced from reference voltage $V_{REF}$. During the time interval $t_1$-$t_2$, a test current $I_{11}$ through the test data line is measured as at locus L11 [located in FIG. 1 at ($t_2$, $V_3$)].

At a time $t_2$, a fourth voltage $V_4$ is applied to the test data line. Fourth voltage $V_4$ is established at a voltage interval ($V_4$-$V_2$) displaced from first voltage $V_1$. During the time interval $t_2$-$t_3$, a test current $I_{21}$ through the test data line is measured as at locus L21 [located in FIG. 1 at ($t_3$, $V_4$)].

At time $t_3$, voltage applied to the test data line is changed again to a new interim voltage level nearer to reference voltage $V_{REF}$. By way of example and not by way of limitation the interim voltage level may be substantially equal with reference voltage $V_{REF}$, as shown in FIG. 1, may be another voltage level between voltage $V_4$ and reference voltage level $V_{REF}$ or may be another voltage level nearer to reference voltage $V_{REF}$ than voltage level $V_4$. In the exemplary embodiment illustrated in FIG. 1, the voltage level during the time interval $t_4$-$t_5$ is substantially equal with voltage level $V_3$. During the time interval $t_4$-$t_5$, a test current $I_{31}$ through the test data line may be measured as at locus L31 [located in FIG. 1 at ($t_5$, $V_3$)].

Prior art methods for evaluation load on the test data line calculated an impedance change value $\Delta Z_{11}$:

$$\Delta Z_{11} = \frac{V_{21} - V_{11}}{I_{21} - I_{11}} \quad [6]$$

Value for $\Delta Z_{11}$ was tested vis-à-vis a standards-set impedance level to decide whether power should be provided to the device then-attached with the data line that was tested. Such computations to determine impedance on a data line were liable to be "fooled" if certain types of loads were attached to the tested data line. By way of example and not by way of limitation, if the load attached to the tested data line has a capacitive component one could be charging the capacitive component of the load while applying various test voltages to the data line, as described above. It is possible that the capacitive load component may be charged to a level to erroneously indicate the appropriate resistive load is attached to the test data line. That is, there could be a false indication of presence of a correct resistive load for accepting power over the data line. If one then provided power over the tested data line, one may be providing power to circuitry designed to accept data-level signals that are significantly lower levels than power-level signals. The result could be a seriously damaged component attached to the tested data line.

The present invention provides for at least three test measurements to ascertain the nature of the load attached to the tested data line. Voltage readings are conducted during time interval $t_1$-$t_2$, during time interval $t_2$-$t_3$ and during time interval $t_4$-$t_5$ as described above in connection with the prior art testing approach. An alternate embodiment of the present invention also includes conducting a voltage reading during time interval $t_5$-$t_6$. According to the method of the present invention, one would evaluate load on the test data line by calculating the impedance change value $\Delta Z_{11}$ (as described in expression [6] above) and impedance change value $\Delta Z_{21}$:

$$\Delta Z_{21} = \frac{V_{31} - V_{11}}{I_{31} - I_{11}} \quad [7]$$

The method of the present invention compares $\Delta Z_{11}$ with $\Delta Z_{21}$. When voltage during time interval $t_1$-$t_2$ is substantially equal with voltage during time interval $t_3$-$t_4$ and the load on the tested data line is substantially resistive then $\Delta Z_{11}$ should substantially equal $\Delta Z_{21}$. If voltages during time intervals $t_1$-$t_2$ and $t_1$-$t_2$ are not substantially equal one may provide prepared reference values for $\Delta Z_{11}$, $\Delta Z_{21}$ to indicate whether a hysteric impedance change occurred in time interval $t_3$-$t_3$ as compared with time interval $t_1$-$t_2$. A hysteric impedance change (i.e., a non-linear impedance change) indicates presence of a load component other than a resistive component, such as a capacitive load component. Such a hysteric impedance change may alert a system or operator to avoid providing power via the data line to the device coupled with the tested data line.

Further assurance of the accuracy of one's conclusion regarding the load coupled with the tested data line may be provided by another test voltage and test current. At a time $t_5$, another voltage level further displaced from reference voltage $V_{REF}$ than voltage level $V_3$ is applied to the test data line. In the exemplary embodiment illustrated in FIG. 1, the voltage level established at time $t_5$ is substantially equal with voltage level $V_3$. During the time interval $t_5$-$t_6$, a test current $I_{41}$ through the test data line may be measured as at locus L41 [located in FIG. 1 at ($t_6$, $V_4$)]. An impedance change $\Delta Z_{31}$ may be calculated:

$$\Delta Z_{31} = \frac{V_{41} - V_{31}}{I_{41} - I_{31}} \quad [8]$$

Comparing impedance change $\Delta Z_{31}$ vis-à-vis impedance change $\Delta Z_{21}$ to observe whether a hysteric impedance change occurs as voltage on the test data line is changed to a value relatively further displaced from reference voltage $V_{REF}$ may provide confirmation of observations made while comparing impedance changes $\Delta Z_{11}$, $\Delta Z_{21}$.

In the preferred embodiment of the method of the present invention, voltages applied to a test data line are substantially equal during time intervals $t_1$-$t_2$, $t_3$-$t_4$ and are substantially equal during time intervals $t_2$-$t_3$, $t_5$-$t_6$. By way of example and not by way of limitation, observing test information to detect hysteric impedance change may be carried out with a significant level of confidence by comparing two or more of:

$$\Delta Z_{11} = \frac{V_{21} - V_{11}}{I_{21} - I_{11}} \quad [6]$$

$$\Delta Z_{21} = \frac{V_{31} - V_{11}}{I_{31} - I_{11}} \quad [7]$$

$$\Delta Z_{31} = \frac{V_{41} - V_{31}}{I_{41} - I_{31}} \quad [8]$$

$$\Delta Z_{41} = \frac{V_{31} - V_{21}}{I_{31} - I_{21}} \quad [9]$$

$$\Delta Z_{51} = \frac{V_{41} - V_{11}}{I_{41} - I_{11}} \quad [10]$$

Other comparisons may also be useful in evaluation a load coupled with a data line.

Figure 2:
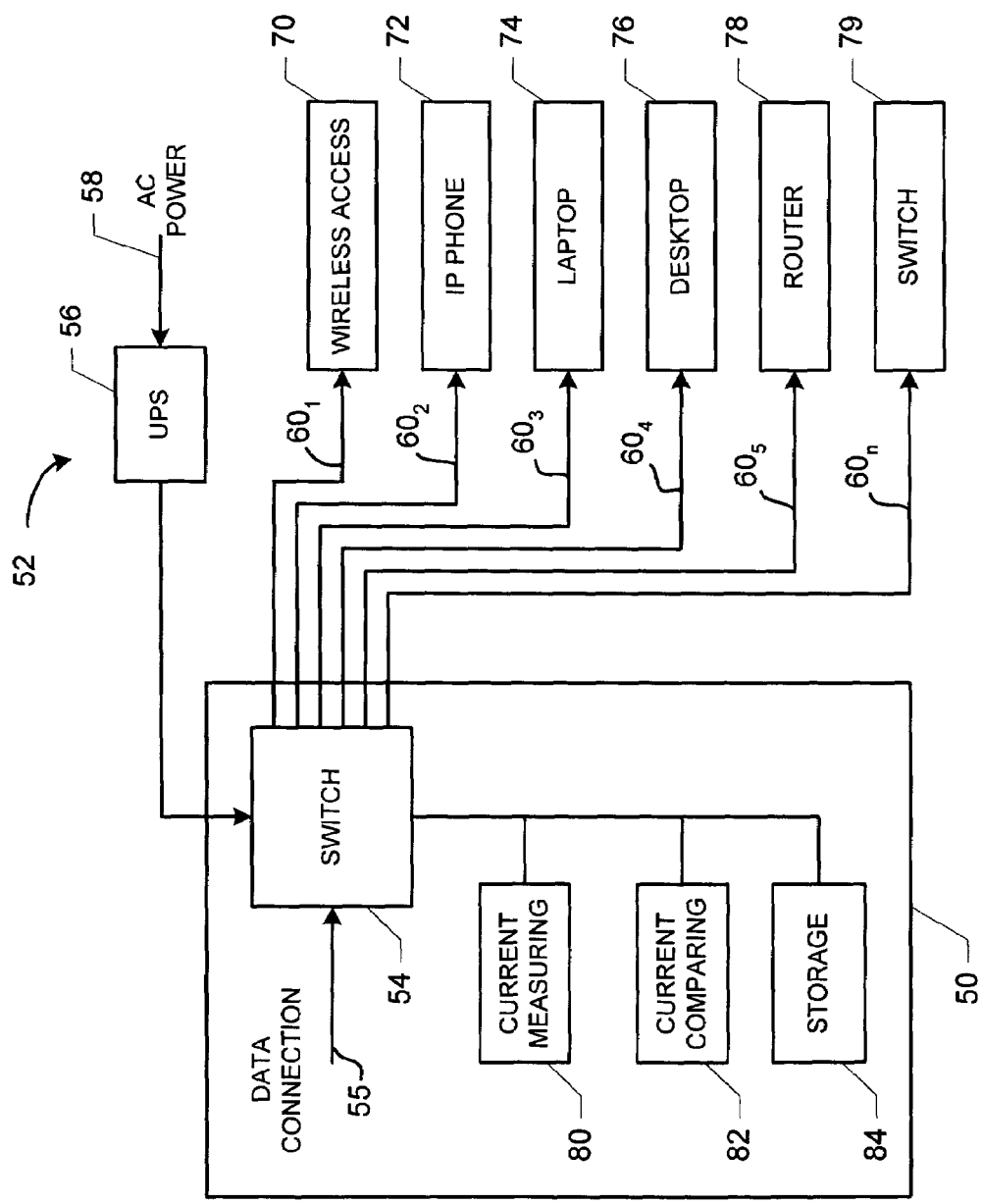
FIG. 2 is a timing diagram illustrating the apparatus of the present invention.

FIG. 2 is a schematic diagram illustrating the apparatus of the present invention. In FIG. 2, an apparatus 50 for characterizing a load on a data line is coupled with a voltage generating device 52. Apparatus 50 includes a switching device 54. In the exemplary embodiment of apparatus 50 illustrated in FIG. 2 voltage generating device 52 includes a uninterruptible power supply (UPS) device 56 coupled with an alternating current (AC) power supply, as indicated at a locus 58 in FIG. 2. Switching device 54 is coupled with a plurality of data lines $60_1$, $60_2$, $60_3$, $60_4$, $60_5$, $60_n$. Data lines $60n$ may be embodied, by way of example and not by way of limitation, in Ethernet data lines. The indicator "n" is employed to signify that there can be any number of data lines coupled with switching device 54. The inclusion of six data lines $60_1$, $60_2$, $60_3$, $60_4$, $60_5$, $60_n$ in FIG. 2 is illustrative only and does not constitute any limitation regarding the number of data lines that may be coupled with switching device 54 in the present invention.

Data line $60_1$ is coupled with a wireless access device 70. Data line $60_2$ is coupled with an Internet protocol (IP) phone device 72. Data line $60_3$ is coupled with a laptop computing device 74. Data line $60_4$ is coupled with a desktop computing device 76. Data line $60_5$ is coupled with a router device 78. Data line $60_n$ is coupled with a data switch device 79. Wireless access device 70 and IP phone device 72 are examples of devices that are commonly configured for powering via a data line. Laptop computing device 74, desktop computing device 76, router device 78 and switch device 79 are examples of devices that are not commonly configured for powering via a data line.

Switching device 54 is coupled with a current measuring device 80, coupled with a current comparing device 82 and coupled with a storage device 84. Switching device 54 receives data via a data connection 55. Switching device 54 effects coupling among UPS device 56, data connection 55 and selected devices 70, 72, 74, 76, 78, 79 via selected data lines $60n$. Switching device 554 applies a plurality of successive voltages to data lines $60n$, substantially as described in connection with, by way of example and not by way of limitation, voltages $V_{REF}$, $V_1$, $V_2$ (FIG. 1). Current measuring device 80 is employed for measuring current on a selected data line $60_n$ while a selected successive voltage $V_{REF}$, $V_1$, $V_2$ is applied to the selected data line $60_n$ (generally as described in connection with FIG. 1). Current comparing device 82 cooperates with storage device 84 to store and compare various currents measured on a selected data line $60_n$ to compare impedance changes on the selected data line $60_n$ in order to observe whether a hysteric impedance change occurs on the selected data line $60_n$ when voltage on the selected data line $60_n$ is varied.

For purposes of this disclosure, a hysteric impedance change occurs when a voltage-current impedance combination experiences an excursion from an initial impedance value at an initial voltage level to a second impedance value at a second voltage level, and returns toward the initial impedance value to a third impedance value at a third voltage level, but the difference between the first impedance value and the third impedance value is not proportional to the difference between the first voltage level and the third voltage level.

It is to be understood that, while the detailed drawings and specific examples given describe preferred embodiments of the invention, they are for the purpose of illustration only, that the apparatus and method of the invention are not limited to the precise details and conditions disclosed and that various changes may be made therein without departing from the spirit of the invention which is defined by the following claims:

The invention claimed is:

1. A method for characterizing a load on a data line; the method comprising the steps of:
   (a) applying a first voltage to said data line; said first voltage having a first voltage value with respect to a reference voltage value;
   (b) measuring a first current value on said data line while said first voltage is applied to said data line;
   (c) applying a second voltage to said data line; said second voltage having a second voltage value displaced a first voltage interval from said first voltage value away from said reference voltage value;
   (d) measuring a second current value on said data line while said second voltage is applied to said data line;
   (e) comparing said second current value with said first current value to determine a first impedance value for said data line;
   (f) applying a third voltage to said data line; said third voltage having a third voltage value displaced a second voltage interval from said second voltage value toward said reference voltage value;
   (g) measuring a third current value on said data line while said third voltage is applied to said data line; and
   (h) comparing said third current value with at least one of said first current value and said second current value to determine whether a hysteretic impedance change occurs when voltage on said data line is varied.

2. A method for characterizing a load on a data line as recited in claim 1 wherein the method comprises the further steps of:
   (i) applying a fourth voltage to said data line; said fourth voltage having a fourth voltage value displaced a third voltage interval from said third voltage value away from said reference voltage value;
   (j) measuring a fourth current value in said data line while said fourth voltage is applied to said data line; and
   (k) comparing said fourth current value with at least one of said first current value, said second current value and said third current value to determine whether a hysteretic impedance change occurs when voltage on said data line is varied.

3. A method for characterizing a load on a data line as recited in claim 2 wherein said third voltage value is substantially equal with said first voltage value and wherein the method further comprises a step (e1) following step (e) and preceding step (f):

(e1) applying an interim voltage to said data line; said interim voltage having an interim voltage value closer to said reference voltage value than said second voltage value.

4. A method for characterizing a load on a data line as recited in claim 3 wherein said interim voltage value is substantially equal with said reference voltage value.

5. A method for characterizing a load on a data line as recited in claim 1 wherein said third voltage value is substantially equal with said first voltage value and wherein the method further comprises a step (e1) following step (e) and preceding step (f):

(e1) applying an interim voltage to said data line; said interim voltage having an interim voltage value closer to said reference voltage value than said second voltage value.

6. A method for characterizing a load on a data line as recited in claim 5 wherein said interim voltage value is substantially equal with said reference voltage value.

7. A method for characterizing a load on a data line; the method comprising the steps of:

(a) applying at least three successive voltages to said data line; each respective odd-numbered successive voltage of said at least three successive voltages having substantially a first voltage value displaced a first voltage interval from a reference voltage value; each respective even-numbered successive voltage of said at least three successive voltages having substantially a second voltage value displaced a second voltage interval from said reference voltage value;

(b) measuring a respective current value on said data line while each of said at least three successive voltages is applied to said data line; and (c) comparing said respective current values for selected successive voltages of said at least three successive voltages to determine whether a hysteretic impedance change occurs when voltage on said data line is varied.

8. A method for characterizing a load on a data line as recited in claim 7 wherein said first voltage interval is less than said second voltage interval.

9. A method for characterizing a load on a data line as recited in claim 7 wherein said first voltage interval is greater than said second voltage interval.

10. A method for characterizing a load on a data line as recited in claim 7 wherein said first voltage interval is greater than said second voltage interval and wherein said at least three successive voltages is three successive voltages.

11. A method for characterizing a load on a data line as recited in claim 7 wherein said first voltage interval is less than said second voltage interval and wherein said at least three successive voltages is four successive voltages.

12. A method for characterizing a load on a data line as recited in claim 7 wherein said first voltage interval is greater than said second voltage interval and wherein said at least three successive voltages is four successive voltages.

13. An apparatus for characterizing a load on a data line; the apparatus comprising:

(a) a voltage generating device coupled with said data line for applying a plurality of successive voltages to said data line;

(b) a current measuring device coupled with said data line for measuring current on said data line while a selected successive voltage of said plurality of successive voltages is applied to said data line; and (c) a current comparing device coupled with said current measuring device for comparing various currents measured on said data line; said current comparing device evaluating said comparing to determine whether a hysteretic impedance change occurs on said data line when voltage on said data line is varied;

wherein said voltage generating device is configured to apply at least three successive voltages to said data line; each respective odd-numbered successive voltage of said at least three successive voltages having substantially a first voltage value displaced a first voltage interval from a reference voltage value; each respective even-numbered successive voltage of said at least three successive voltages having substantially a second voltage value displaced a second voltage interval from said reference voltage value.

14. An apparatus for characterizing a load on a data line as recited in claim 13 wherein said current measuring device is configured to measure a respective current value on said data line while said data line has each successive voltage of said at least three successive voltages applied to said data line.

15. An apparatus for characterizing a load on a data line as recited in claim 13 wherein said current measuring device is configured to measure a respective current value on said data line while said data line has each successive voltage of said at least three successive voltages applied to said data line.

* * * * *